United States Patent
Cheng

(10) Patent No.: US 10,741,767 B2
(45) Date of Patent: Aug. 11, 2020

(54) ORGANIC THIN FILM TRANSISTOR, AND FABRICATING METHOD THEREOF

(71) Applicant: BOE TECHNOLOGY GROUP CO., LTD, Beijing (CN)

(72) Inventor: Leilei Cheng, Beijing (CN)

(73) Assignee: BOE TECHNOLOGY GROUP CO., LTD, Beijing (CN)

( * ) Notice: Subject to any disclaimer, the term of this patent is extended or adjusted under 35 U.S.C. 154(b) by 39 days.

(21) Appl. No.: 15/501,286

(22) PCT Filed: Aug. 15, 2016

(86) PCT No.: PCT/CN2016/095305
§ 371 (c)(1),
(2) Date: Feb. 2, 2017

(87) PCT Pub. No.: WO2017/128697
PCT Pub. Date: Aug. 3, 2017

(65) Prior Publication Data
US 2018/0053896 A1 Feb. 22, 2018

(30) Foreign Application Priority Data

Jan. 29, 2016 (CN) .......................... 2016 1 0066532

(51) Int. Cl.
*H01L 51/05* (2006.01)
*H01L 51/00* (2006.01)

(52) U.S. Cl.
CPC ...... *H01L 51/0036* (2013.01); *H01L 51/0001* (2013.01); *H01L 51/0533* (2013.01); *H01L 51/0545* (2013.01); *H01L 51/055* (2013.01)

(58) Field of Classification Search
CPC ............ H01L 29/41733; H01L 29/401; H01L 29/78669; H01L 29/78678;
(Continued)

(56) References Cited

U.S. PATENT DOCUMENTS

2006/0052195 A1* 3/2006 Hu ...................... H01L 51/0533
474/122
2006/0289858 A1 12/2006 Park et al.
(Continued)

FOREIGN PATENT DOCUMENTS

CN 103413891 A 11/2013
CN 103579502 A 2/2014
(Continued)

OTHER PUBLICATIONS

Machine translation of CN 105047677, translated Feb. 21, 2018.*
(Continued)

*Primary Examiner* — Lauren R Bell
(74) *Attorney, Agent, or Firm* — Anova Law Group, PLLC

(57) ABSTRACT

In accordance with various embodiments of the disclosed subject matter, an organic thin film transistor, and a fabricating method thereof are provided. In some embodiments, the method for forming an organic thin film transistor (OTFT), comprising: forming a transparent gate layer on a transparent base substrate; forming a first initial silicone polymer layer on the transparent gate layer; and performing an oxidization process to partially oxidize the first initial silicone polymer layer to form a gate insulating layer, including an oxidized inorganic sub-layer that contacts the transparent gate layer, and a non-oxidized organic sub-layer.

16 Claims, 5 Drawing Sheets

(58) Field of Classification Search
CPC ............ H01L 29/66765; H01L 51/105; H01L 51/0001; H01L 51/0545
See application file for complete search history.

(56) References Cited

U.S. PATENT DOCUMENTS

| | | | | |
|---|---|---|---|---|
| 2007/0114920 | A1* | 5/2007 | Shin | H01L 27/283 313/504 |
| 2009/0256138 | A1* | 10/2009 | Wu | H01L 51/0036 257/40 |
| 2009/0297868 | A1* | 12/2009 | Ito | H01L 51/0533 428/447 |
| 2010/0283044 | A1* | 11/2010 | Inoue | H01L 51/052 257/40 |
| 2017/0309654 | A1 | 10/2017 | Cheng et al. | |

FOREIGN PATENT DOCUMENTS

| | | | | |
|---|---|---|---|---|
| CN | 103730574 | A | | 4/2014 |
| CN | 103985764 | A | | 8/2014 |
| CN | 105047677 | A | * | 11/2015 ............. H01L 21/77 |
| CN | 105489762 | A | | 4/2016 |

OTHER PUBLICATIONS

The World Intellectual Property Organization (WIPO) International Search Report for PCT/CN2016/095305 dated Nov. 25, 2016 p. 1-13.
State Intellectual Property Office of the P.R.C (SIPO) Office Action 1 for 201610066532.4 dated Aug. 16, 2016 p. 1-5.
The European Patent Office (EPO) The Extended European Search Report for 16834225.1 dated Sep. 30, 2019 10 Pages.
Huang C et al. "Organic Field-Effect Transistors and Unipolar Logic Gates on Charged Electrets From Spin-On Organosilsesquioxane Resing", Advanced Functional Materials, Wiley-V C H Verlag GmbH & Co. KGAA, DE, vol. 17, No. 1, Jan. 5, 2007 (200-01-05), pp. 142-153, XP001504246, ISSN: 1616-301X, DOI: 10.1002/ADFM. 200600690 12 Pages.
Kim Sung-Jin et al. "Isolation of organic field-effect transistors by surface patterning with an UV/ozone process", Journal of Vacuum Science and Technology: Part B, AVS / AIP, Melville, New York, NY, US, vol. 27, No. 3, Apr. 24, 2009 (Apr. 24, 2009), pp. 1057-1059, XP012129241, ISSN: 1071-1023, DOI: 10.1116/1. 311350 3 Pages.

* cited by examiner

ORGANIC THIN FILM TRANSISTOR, AND FABRICATING METHOD THEREOF

CROSS-REFERENCES TO RELATED APPLICATIONS

This application is a national phase entry under 35 U.S.C. § 371 of International Application No. PCT/CN2016/095305, filed on Aug. 15, 2016, which claims priority to Chinese Patent Application No. 201610066532.4 filed on Jan. 29, 2016. The above enumerated patent applications are incorporated by reference herein in their entirety.

TECHNICAL FIELD

The disclosed subject matter generally relates to display technologies and, more particularly, relates to an organic thin film transistor, and a fabricating method thereof.

BACKGROUND

The products of organic thin film transistor (OTFT) driven displays and electronic papers have been gradually entered into the market. An active layer of the OTFT is an organic active layer made by an organic semiconductor material.

The active layer may be made of small organic molecule and polymer semiconductor materials that have high migration rate, good solution processing ability, and stable environment providing ability. With the ongoing and in-depth study of the OTFT, it has been found that the carriers in the OTFT are conducted by a transition mode due to the existing of the intermolecular forces in the organic semiconductor materials. The organic semiconductors are being in a "molecular solid" form. Such special form can make the organic active layer made by an organic semiconductor be more susceptible by the insulating layer resulting in significant changes in the carrier mobility, thus affecting the performances of the OTFT devices.

To solve the problem that the organic active layer made by an organic semiconductor is susceptible from the insulating layer and causes significant changes in the carrier mobility, an organic polymer material is usually used as the insulating layer of an OTFT. However, the dielectric constant of the organic polymer material is relatively low. When the organic polymer material is used alone as the insulating layer of an OTFT device, the threshold voltage of the OTFT device is relatively high, and the leakage current is relatively large.

Accordingly, it is desirable to provide an organic thin film transistor, and a fabricating method thereof to at least partially alleviate one or more problems set forth above and to solve other problems in the art.

BRIEF SUMMARY

In accordance with some embodiments of the disclosed subject matter, an organic thin film transistor, and a fabricating method thereof are provided.

One aspect of the disclosed subject matter provides a method for a method for forming an organic thin film transistor (OTFT), comprising: forming a transparent gate layer on a transparent base substrate; forming a first initial silicone polymer layer on the transparent gate layer; and performing an oxidization process to partially oxidize the first initial silicone polymer layer to form a gate insulating layer, including an oxidized inorganic sub-layer that contacts the transparent gate layer, and a non-oxidized organic sub-layer.

In some embodiments, forming a first initial silicone polymer layer on the transparent gate comprises: forming a polydimethylsiloxane film, or a derivative of polydimethylsiloxane film on the transparent gate.

In some embodiments, the derivative of polydimethylsiloxane film is a hydroxylated polydimethylsiloxane film.

In some embodiments, performing an oxidization process to partially oxidize the first initial silicone polymer layer comprises: performing an ultraviolet radiation treatment to partially oxidize the first initial silicone polymer layer to form the gate insulating layer, wherein the oxidized inorganic sub-layer is a $SiO_2$ sub-layer, and the non-oxidized organic sub-layer is an initial silicone polymer sub-layer; and performing a low-temperature solidifying process to cure the gate insulating layer after performing the ultraviolet radiation treatment.

In some embodiments, the method further comprises: forming a recessed part on the gate insulating layer; and using a solution process to form a source electrode and a drain electrode in the recessed part.

In some embodiments, the method further comprises: before using a solution process forming the source electrode and the drain electrode in the recessed part, coating a surface energy reducing solution on the gate insulating layer other than the recessed part.

In some embodiments, coating a surface energy reducing solution on the gate insulating layer other than the recessed part comprises: overlying the transparent base substrate on a carrying substrate that is coated with a surface energy reducing solution, such that a portion of the gate insulating layer other than the recessed part contacts with the surface energy reducing solution coated on the carrying substrate; and removing the carrying substrate.

In some embodiments, the method further comprises: forming an organic semiconductor layer that contacts with both the source electrode and the drain electrode as an active layer.

In some embodiments, forming the source electrode and the drain electrode comprises: dispersing a metal material in a hydrophilic solvent to form a solution; and applying the solution into the recessed part; and evaporating the hydrophilic solvent of the solution to form the source electrode and the drain electrode by using a low-temperature solidifying process.

In some embodiments, the metal material is one of gold, aluminum, chromium titanium, nickel, molybdenum, and an alloy thereof.

In some embodiments, wherein the hydrophilic solvent is an ethanol solvent.

In some embodiments, the recessed part is formed by using an imprinting lithography process.

In some embodiments, the surface energy reducing solution is hexamethyldisilazane solution, or an octadecyltrichlorosilane solution.

In some embodiments, the method further comprises: a material of the active layer is one of polythiophene, polyaniline, polypyrrole, polyfluorene, pentacene, and titanyl phthalocyanine.

In some embodiments, a material of the transparent gate layer is one of indium tin oxide, indium zinc oxide, and graphene.

In some embodiments, the organic semiconductor layer is formed by using an ink-jet printing method.

In some embodiments, the method further comprises: forming a protecting layer on the active layer, including: forming a second initial silicone polymer layer on the active layer; performing an oxidization process to partially oxidize the second initial silicone polymer layer to form an oxidized inorganic protecting sub-layer and a non-oxidized organic protecting sub-layer.

In some embodiments, forming a protecting layer on the active layer further including: performing an ultraviolet radiation treatment to partially oxidize the second initial silicone polymer layer to form the protecting layer, wherein the oxidized inorganic protecting sub-layer is a $SiO_2$ sub-layer, and the non-oxidized organic protecting sub-layer contacts the active layer; and performing a low-temperature solidifying process to cure the protecting layer after performing the ultraviolet radiation treatment.

In some embodiments, the second initial silicone polymer layer is a polydimethylsiloxane film, or a derivative of polydimethylsiloxane film.

In some embodiments, the first initial silicone polymer layer and the second initial silicone polymer layer are formed by using a coating process, or a spin coating process.

In some embodiments, the low-temperature solidifying process to the gate insulating layer is performed in a temperature range between 20° C. to 60° C.; and the low-temperature solidifying process to the protecting layer is performed in a temperature range between 20° C. to 60° C.

In some embodiments, the low-temperature solidifying process to the gate insulating layer has a duration between 4 hours to 8 hours; and the low-temperature solidifying process to the protecting layer has a duration between 4 hours to 8 hours.

Another aspect of the disclosed provided an organic thin film transistor, comprising: a transparent base substrate; a transparent gate layer on the base substrate; and a gate insulating layer formed by partially oxidizing a first initial silicone polymer layer on the transparent gate layer, wherein the gate insulating layer includes an oxidized inorganic sub-layer that contact the transparent gate layer, and a non-oxidized organic sub-layer on the oxidized organic sub-layer.

In some embodiments, the silicone polymer layer is a polydimethylsiloxane film or a derivative of polydimethylsiloxane layer; the oxidized inorganic sub-layer is a $SiO_2$ film; and the non-oxidized organic sub-layer is a polydimethylsiloxane film or a derivative of polydimethylsiloxane film.

In some embodiments, the organic thin film transistor further comprises: a protecting layer armed by partially oxidizing a second initial silicone polymer layer.

In some embodiments, the protecting layer include a $SiO_2$ film and a polydimethylsiloxane film, or the protecting layer include a $SiO_2$ film and a derivative of polydimethylsiloxane film.

Other aspects of the disclosed subject matter can be understood by those skilled in the art in light of the description, the claims, and the drawings of the present disclosure.

BRIEF DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like elements. It should be noted that the following drawings are merely examples for illustrative purposes according to various disclosed embodiments and are not intended to limit the scope of the present disclosure.

DETAILED DESCRIPTION

For those skilled in the art to better understand the technical solution of the disclosed subject matter, reference will now be made in detail to exemplary embodiments of the disclosed subject matter, which are illustrated in the accompanying drawings. Wherever possible, the same reference numbers will be used throughout the drawings to refer to the same or like parts.

In accordance with various embodiments, the disclosed subject matter provides an organic thin film transistor, and a fabricating method thereof.

In the disclosed fabricating method for forming an organic thin film transistor (OTFT), a gate insulating layer can be formed on a substrate having a gate electrode, a drain electrode and an organic insulating layer can be formed on the gate insulating layer, and then a pattern of a protecting layer and pixel electrodes can be formed on the drain electrode and the organic insulating layer. By using a simple process to the organic polymers, an inorganic-organic insulating layer can be formed to eliminate the defects of the gate insulating layer, to obtain a small leakage current, to reduce the hysteresis effect, and to improve the forming process of the insulating layer. The disclosed method further uses a solution process to form a source electrode and a drain electrode on the organic insulating layer to obtain a good ohmic contact with the organic semiconductor channel, thereby improving the response speed. The disclosed subject matter can replace the complex and unstable OTFT substrate preparation process, can improve the production efficiency, can reduce production costs, and can improve OTFT device performance.

Figure 1:
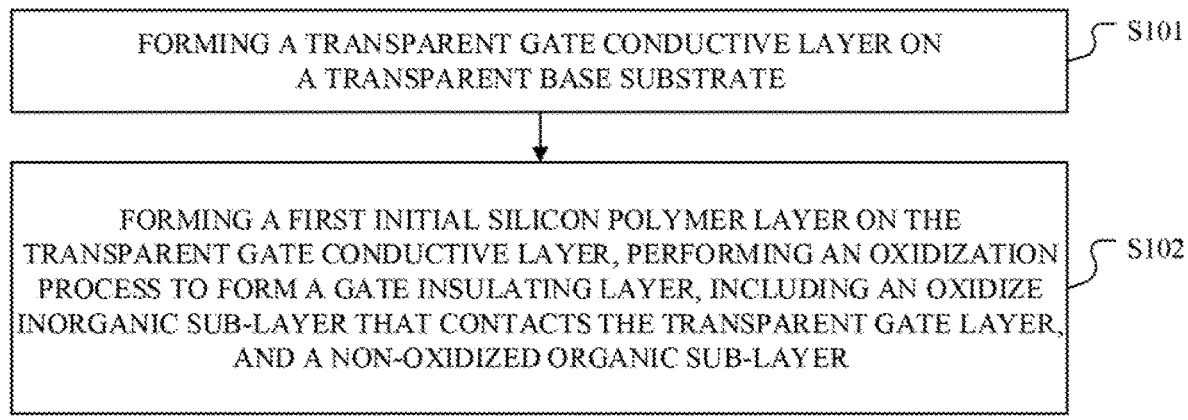
FIG. 1 is a flowchart of an exemplary method for fabricating an organic thin film transistor in accordance with some embodiments of the disclosed subject matter.

Referring to FIG. 1, a flowchart of an exemplary method for fabricating an organic thin film transistor is shown in accordance with some embodiments of the disclosed subject matter. As illustrated, the method can include the following steps.

Step 101: forming a transparent gate layer on a transparent base substrate. For example, a base substrate can be transparent to ultraviolet light or ozone light.

In some embodiments, a material of the gate layer can be indium tin oxide (ITO), indium zinc oxide (IZO), graphene, or any other suitable material which an ultraviolet light can pass through.

Step 102: forming a first initial silicone polymer layer on the transparent gate layer, performing an oxidization process to partially oxidize the first silicone polymer layer to form a gate insulating layer, including an oxidized inorganic sub-layer that contacts the transparent gate layer, and a non-oxidized organic sub-layer.

In some embodiments, the first initial silicone polymer layer can be a polydimethylsiloxane (PDMS) film, or a derivative of polydimethylsiloxane film. The derivative of polydimethylsiloxane is PS-b-PDMS or hydroxylated polydimethylsiloxane.

In the following description, PDMS and ultraviolet (UV) light are used for example. A PDMS film can be formed on the transparent gate layer. An ultraviolet (UV) treatment can be performed on one surface of the first initial PDMS film facing the gate layer to form a first $SiO_2$ film. Then a low-temperature solidifying process can be performed to cure the first $SiO_2$ film and the remaining first initial PDMS film to form a gate insulating layer.

In some embodiments, the PDMS film can be replaced by any other suitable silicone polymer film, such as a polydimethylsiloxane (PDMS) film, or a polydimethylsiloxane derivative film, etc. The reason to use the hydroxylated polydimethylsiloxane (PDMS) film is that it has a hydrophilic nature.

A duration time and a temperature of the low-temperature solidifying process can be adjusted based on different product requirements. In some embodiments, a temperature of the low-temperature solidifying performed to the first $SiO_2$ film and the first initial PDMS film can be in a range between 20° C. and 60° C., and a duration time of the low-temperature solidifying process can be in a range between 4 hours to about 8 hours, for example, about 6 hours.

In some embodiments, PDMS material is used for forming the gate insulating layer. PDMS is a silicone polymer having electrical insulating properties, and resistances to high temperature and low temperature. It can be used for a long term in an environment having a temperature from −50° C. to 250° C. Furthermore, PDMS has a large compression rate, a low surface tension, a good water repellency and a moisture resistance. Due to the low surface tension, a fluid form of the PDMS can easily form a smooth and uniform coating.

By using one surface of the first PDMS film facing the gate layer to form the first $SiO_2$ film, a gate insulating layer can be formed including the $SiO_2$ film and the first initial PDMS film. The $SiO_2$ film and the first initial PDMS film can reduce the interfacial defects of the gate insulating layer. Thereby the fabricated OTFT can have a small leakage current which may reduce the hysteresis effect.

In such embodiments, by performing a UV treatment on one surface of the first initial PDMS film through the gate layer to form a first $SiO_2$ film on the gate layer, the formed gate insulating layer can include the first $SiO_2$ film and the first initial PDMS film. Thus the problems of high threshold voltage and large leakage current caused by using a single PDMS film as the gate insulating layer can be solved.

Figure 2:
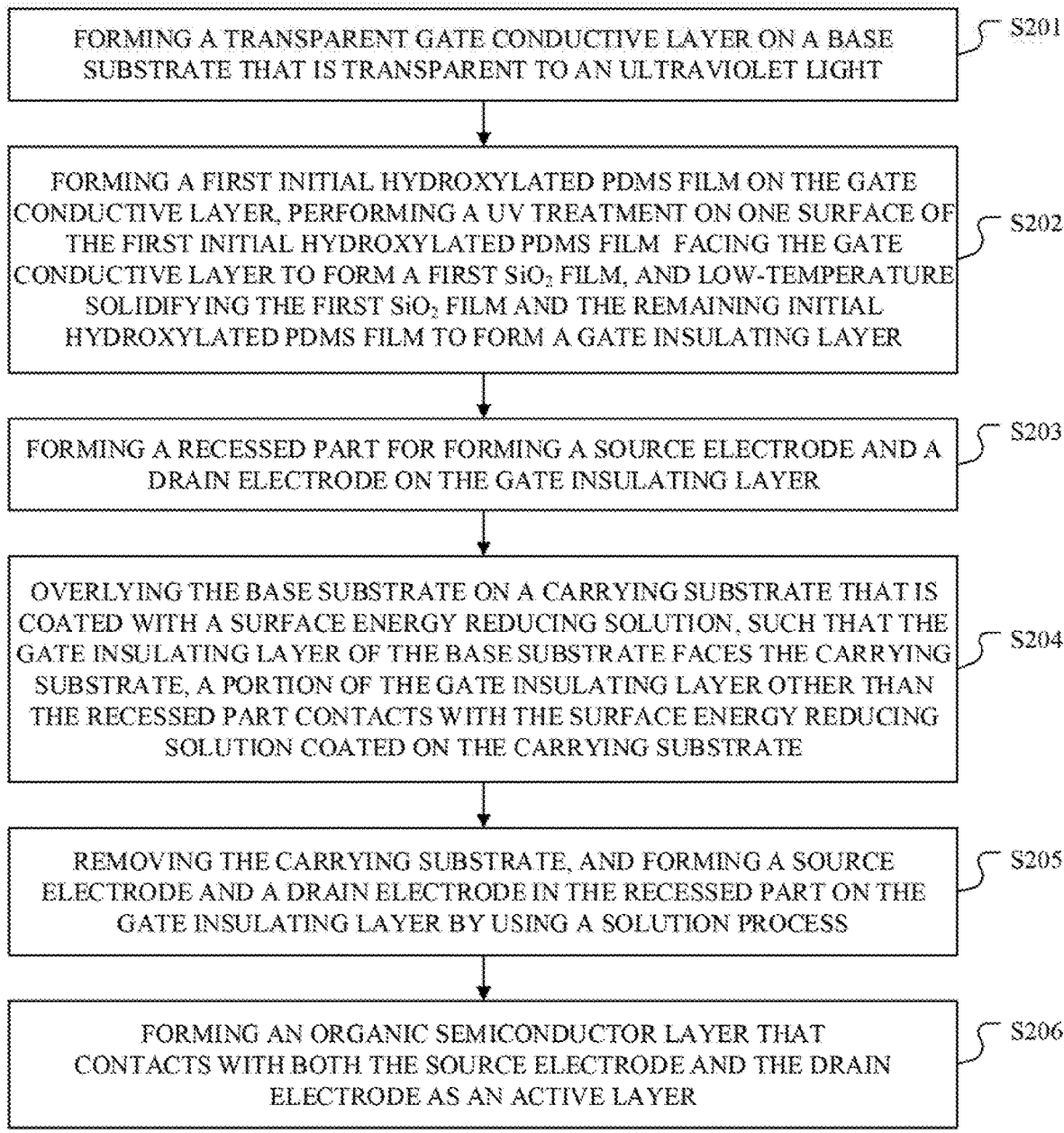
FIG. 2 is a flowchart of another exemplary method for fabricating an organic thin film transistor in accordance with some other embodiments of the disclosed subject matter.

Turning to FIG. 2, a flowchart of another exemplary method for fabricating an organic thin film transistor is shown in accordance with some other embodiments of the disclosed subject matter. As illustrated, the method for fabricating an organic thin film transistor can include the followings steps.

In the following description, hydroxylated PDMS and ultraviolet (UV) light are used for example.

Step 201: forming a transparent gate layer on a base substrate that is transparent to an ultraviolet light.

Step 202: forming a first initial hydroxylated polydimethylsiloxane film on the gate layer, performing an ultraviolet (UV) treatment on one surface of the first initial hydroxylated PDMS film facing the gate layer to form a first $SiO_2$ film, and low-temperature solidifying the first $SiO_2$ film and the remaining first initial hydroxylated PDMS film to form a gate insulating layer.

Step 203: forming a recessed part on the gate insulating layer.

Preferably, the recessed part is formed by using an imprinting lithography process. In some embodiments, the recessed part is formed on a location that is to form a source electrode and a drain electrode.

Step 204: overlying the base substrate on a carrying substrate that is coated with a surface energy reducing solution.

After the overlying, the gate insulating layer of the base substrate faces the carrying substrate, a portion of the gate insulating layer other than the recessed part contacts with the surface energy reducing solution coated on the carrying substrate.

Preferably, the surface energy reducing solution is hexamethyldisilazane (HMDS) solution, or octadecyltrichlorosilane (OTS) solution.

Step 205: removing the carrying substrate, and forming a source electrode and a drain electrode in the recessed part on the gate insulating layer by using a solution process.

By using the solution process to form a source electrode and a drain electrode on an organic layer of the gate insulating layer, the source electrode and the drain electrode can have a good ohmic contact with an organic semiconductor layer that is to be formed in the subsequent step, thereby improving a response speed of the OTFT.

Specifically, forming a source electrode and a drain electrode in the recessed part on the gate insulating layer by using a solution process can include the following processes: dispersing a metal material in a hydrophilic solvent to form a solution; applying the solution into the recessed part and evaporating the hydrophilic solvent of the solution to form the source electrode and the drain electrode by using a low-temperature solidifying process.

The metal material of the source electrode and the drain electrode can be dispersed uniformly in a hydrophilic solvent.

The hydrophilic solvent having uniformly dispersed metal material can be applied into the recessed part by using a coating method such as a spin coating method.

A low-temperature solidifying process can be performed to evaporate the hydrophilic solvent to form the source electrode and the drain electrode.

Step 206: forming an organic semiconductor layer that contacts with both the source electrode and the drain electrode as an active layer.

In some embodiments, the metal material of the source electrode and the drain electrode can be selected from gold, aluminum, chromium, titanium, nickel, molybdenum, etc., or any suitable alloy thereof. The hydrophilic solvent can be, for example, ethanol solvent.

The organic semiconductor layer can be formed by using an inkjet printing method. The material of the active layer can be a film of any one of the following materials: polythiophene (P3HT), polyaniline (PAE), polypyrrole, polyfluorene (PF), pentacene, titanyl phthalocyanine (TiOPC), etc.

In such embodiments, by performing a treatment on one surface of the hydroxylated PDMS film facing the gate layer to form a first $SiO_2$ film, the formed gate insulating layer can include the first $SiO_2$ film and remaining hydroxylated PDMS film. Thus the problems of high threshold voltage and large leakage current caused by using a single PDMS film as the gate insulating layer can be solved. Further, by using a solution process to form a source electrode and a drain electrode on an organic layer of the gate insulating layer, the source electrode and the drain electrode can have a good ohmic contact with an organic semiconductor layer that is to be formed in the subsequent step, thereby improving a response speed of the OTFT.

Figure 3:
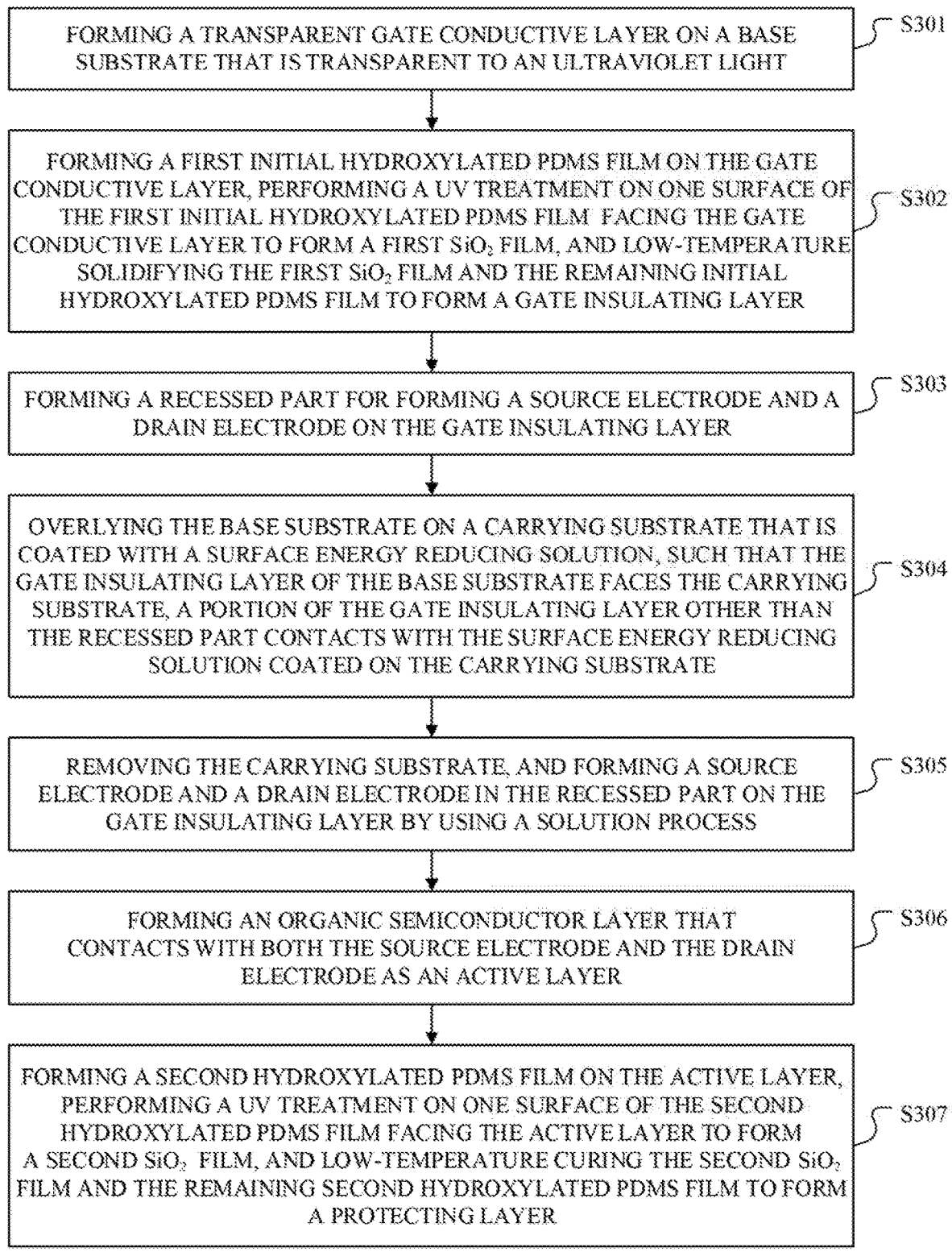
FIG. 3 is a flowchart of another exemplary method for fabricating an organic thin film transistor in accordance with some other embodiments of the disclosed subject matter.

Turning to FIG. 3, a flowchart of another exemplary method for fabricating an organic thin film transistor is shown in accordance with some other embodiments of the disclosed subject matter. As illustrated, the method or fabricating an organic thin film transistor can include the following steps.

In the following description, hydroxylated PDMS and ultraviolet (UV) light are used for example.

Step 301: forming a transparent gate layer on a base substrate that is transparent to an ultraviolet light.

In some embodiments, a material of the gate layer can be indium tin oxide (ITO), indium zinc oxide (IZO), graphene, or any other suitable material which an ultraviolet light can pass through.

Step 302: forming a first initial hydroxylated polydimethylsiloxane (PDMS) film on the gate layer, performing an ultraviolet (UV) treatment on one surface of the first initial hydroxylated PDMS film facing the gate layer to form a first $SiO_2$ film, and low-temperature solidifying the first $SiO_2$ film and the remaining first initial hydroxylated PDMS film to form a gate insulating layer.

A duration time and a temperature of the low-temperature solidifying process can be adjusted based on different product requirements. In some embodiments, a temperature of the low-temperature solidifying performed to the first $SiO_2$ film and the first initial hydroxylated PDMS film can be in a range between 20° C. and 60° C., and a duration time of the low-temperature solidifying process can be in a range between 4 hours to about 8 hours, for example, about 6 hours.

In some embodiments, polydimethylsiloxane (PDMS) material is used for forming the gate insulating layer. PDMS is a silicone polymer having electrical insulating properties, and resistances to high temperature and low temperature. It can be used for a long term in an environment having a temperature from −50° C. to 250° C. Furthermore, PDMS has a large compression rate, a low surface tension, a good water repellency and a moisture resistance. Due to the low surface tension, a fluid form of the PDMS can easily form a smooth and uniform coating.

By oxidizing one surface of the first initial hydroxylated PDMS film facing the gate layer to form the first $SiO_2$ film, a gate insulating layer can be formed including the $SiO_2$ film and the remaining first initial hydroxylated PDMS film. The $SiO_2$ film and the first initial hydroxylated PDMS film can reduce the interfacial defects of the gate insulating layer. Thereby the fabricated OTFT can have a small leakage current which may reduce the hysteresis effect.

Step 303: forming a recessed part of on the gate insulating layer.

Preferably, the recessed part is formed by using an imprinting lithography process.

Step 304: overlying the base substrate on a carrying substrate that is coated with a surface energy reducing solution. After the overlying, the gate insulating layer of the base substrate faces the carrying substrate, a portion of the gate insulating layer other than the recessed part contacts with the surface energy reducing solution coated on the carrying substrate.

Preferably, the surface energy reducing solution is hexamethyldisilazane (HMDS) solution, or octadecyltrichlorosilane (OTS) solution.

Step 305: removing the carrying substrate, and forming a source electrode and a drain electrode in the recessed part on the gate insulating layer by using a solution process.

By using the solution process to form a source electrode and a drain electrode on an organic layer of the gate insulating layer, the source electrode and the drain electrodes can have a good ohmic contact with an organic semiconductor layer that is to be formed in the subsequent step, thereby improving a response speed of the OTFT.

Specifically, forming a source electrode and a drain electrode in the recessed part on the gate insulating layer by using a solution process can include the following processes.

A metal material of the source electrode and the drain electrode can be dispersed uniformly in a hydrophilic solvent.

The hydrophilic solvent having uniformly dispersed metal material can be filled into the recessed part by using a coating method such as a spin coating method.

A low-temperature solidifying process can be performed to evaporate the hydrophilic solvent to form the source electrode and the drain electrode.

Step 306: forming an organic semiconductor layer that contacts with both the source electrode and the drain electrode as an active layer.

In some embodiments, the metal material of the source electrode and the drain electrode can be selected from gold, aluminum, chromium, titanium, nickel, molybdenum, etc., or any suitable alloy thereof. The hydrophilic solvent can be, for example, ethanol solvent.

The organic semiconductor layer can be formed by using an it printing method. The material of the active layer can be a film of any one of the following material: polythiophene (P3HT), polyaniline (PAE), polypyrrole, polyfluorene (PF), pentacene, titanyl phthalocyanine (TiOPC), etc.

Step 307: forming a second initial hydroxylated PDMS film on the active layer, performing an ultraviolet (UV) treatment on one surface of the second initial hydroxylated PDMS film facing the active layer to form a second $SiO_2$ film, and low-temperature solidifying the second $SiO_2$ film and the remaining second initial hydroxylated PDMS film to form a protecting layer.

The formation of gate insulating layer and the process of forming protecting layer are the same.

In some embodiments, the second initial hydroxylated polydimethylsiloxane (PDMS) layer can be formed by using a coating method, or a spin coating method.

A duration time and a temperature of the low-temperature solidifying process can be adjusted based on different product requirements. In some embodiments, a temperature of the low-temperature solidifying performed to the second SiO₂ film and the second initial hydroxylated PDMS film can be in a range between 20° C. and 60° C. and a duration time of the low-temperature solidifying process can be in a range between 4 hours to about 8 hours, for example, about 6 hours.

In such embodiments, by performing a UV treatment on one surface of the hydroxylated PDMS film facing the gate layer to form a first SiO₂ film, the formed gate insulating layer can include the first SiO₂ film and the remaining hydroxylated PDMS film. Thus the problems of high threshold voltage and large leakage current caused by using a single PDMS film as the gate insulating layer can be solved.

Further, by using a solution process to form a source electrode and a drain electrode on an organic layer of the gate insulating layer, the source electrode and the drain electrode can have a good ohmic contact with an organic semiconductor layer that is to be formed in the subsequent step, thereby improving a response speed of the OTFT. Further, a stacking layer including a second SiO₂ film and a second initial hydroxylated PDMS film can be formed on the active layer to protect the active layer.

In order to more clearly describe the disclosed subject matter, the method for forming the organic thin film transistor on certain stages are described below in connection with FIGS. 4-8.

Figure 4:
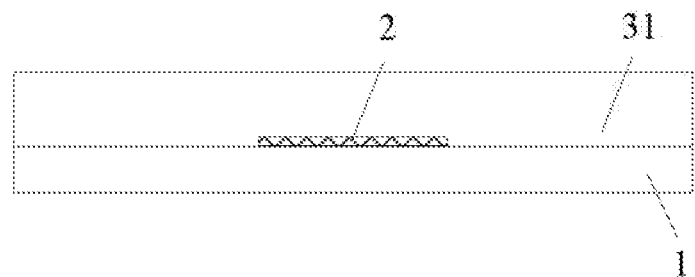
FIG. 4 is a schematic diagram of a first initial polydimethylsiloxane (PDMS) film of the organic thin film transistor formed on a gate layer in accordance with some embodiments of the disclosed subject matter.

Referring to FIG. 4, a schematic diagram of a first initial hydroxylated polydimethylsiloxane (PDMS) film of the organic thin film transistor formed on a gate layer is shown in accordance with some embodiments of the disclosed subject matter.

As illustrated, a gate layer 2 is formed on a base substrate 1, a first initial PDMS film 31 is formed on the gate layer 2. A material of the base substrate 1 can be transparent to an ultraviolet light. Similarly, a material of the gate layer 2 can also be transparent to an ultraviolet light. The material of the gate layer 2 can be selected from indium tin oxide (ITO) or indium zinc oxide (IZO).

In some embodiments, the first initial PDMS film 31 can be replaced by a first initial hydroxylated PDMS film 31.

Figure 5:
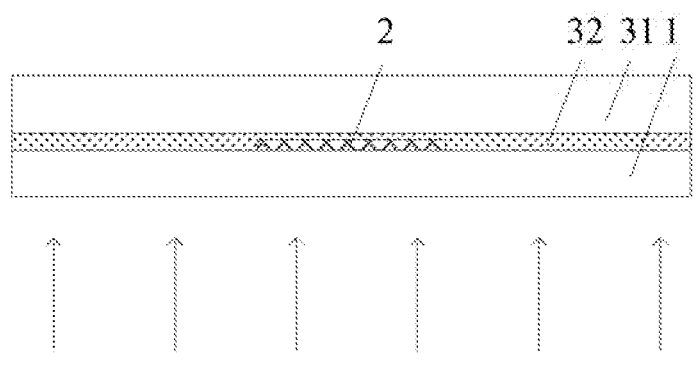
FIG. 5 is a schematic structural diagram of a first $SiO_2$ film of the organic thin film transistor formed by performing an ultraviolet treatment to the first initial PDMS in accordance with some embodiments of the disclosed subject matter.

Referring to FIG. 5, a schematic structural diagram of a first SiO₂ film of the organic thin film transistor formed by performing an ultraviolet treatment to the first initial PDMS film is shown in accordance with some embodiments of the disclosed subject matter.

As illustrated, one surface of the first initial PDMS film facing the gate layer 2 can be performed by an ultraviolet (UV) treatment and followed by a low-temperature solidifying process to convert the surface of the first initial PDMS film 31 into a first SiO₂ film 32. The remaining first initial PDMS film 31 and the first SiO₂ film 32 can constitute the gate insulating layer 3.

In some embodiments, a temperature of the low-temperature solidifying process can be in a range between 20° C. and 60° C., for example, about 40° C., and a duration period of the low-temperature solidifying process can be in a range between 4 hours to about 8 hours, for example, about 6 hours.

Figure 6:
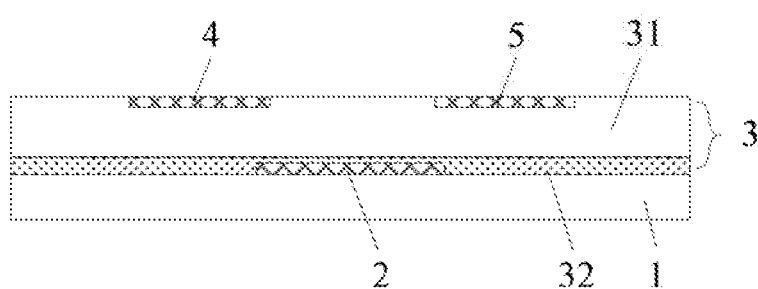
FIG. 6 is a schematic diagram of a source electrode and a drain electrode of the organic thin film transistor in accordance with some embodiments of the disclosed subject matter.

Referring to FIG. 6, a schematic diagram of a source electrode and a drain electrode of the organic thin film transistor is shown in accordance with some embodiments of the disclosed subject matter.

As illustrated, a source electrode 4 and a drain electrode 5 can be formed on the gate insulating layer 3. An exemplary method for forming the source electrode 4 and the drain electrode 5 can be a solution process.

Figure 7:
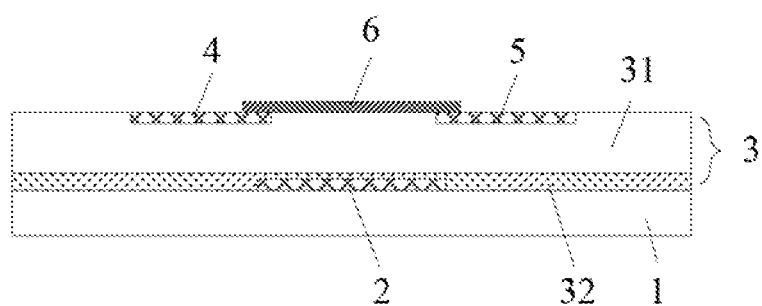
FIG. 7 is a schematic diagram of an active layer of the organic thin film transistor in accordance with some embodiments of the disclosed subject matter.

Referring to FIG. 7, a schematic diagram of an active layer of the organic thin film transistor is shown in accordance with some embodiments of the disclosed subject matter.

As illustrated, an active layer 6 can be formed on the source electrode 4 and the drain electrode 5.

It should be noted that, the structure shown in FIG. 7 can be regarded as an exemplary OTFT fabricated by all steps of the method described above in connection with FIG. 1, or as an exemplary OTFT fabricated by a portion of steps of the method described above in connection with FIG. 2.

It also should be noted that, a protecting layer 7 can also be formed on the active layer 6. A method for forming the protecting layer 7 can be similar to the process for forming the gate insulating layer 3. A difference is that the protecting layer 7 includes a second SiO₂ film and a second PDMS film or a second hydroxylated PDMS film. The second SiO₂ film is on one surface of the second PDMS film or the second hydroxylated PDMS film that faces away from the gate layer 2.

Figure 8:
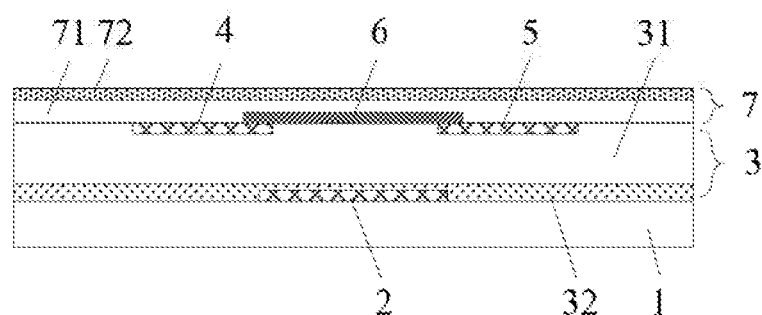
FIG. 8 is a schematic structural diagram of a second initial PDMS film and a second $SiO_2$ film of the organic thin film transistor formed on the active layer in accordance with some other embodiments of the disclosed subject matter.

Referring to FIG. 8, a schematic structural diagram of a second initial hydroxylated PDMS film and a second SiO₂ film of the organic thin film transistor formed on the active layer is shown in accordance with some other embodiments of the disclosed subject matter.

As illustrated, the organic thin film transistor can include the following components.

A transparent base substrate 1.

A transparent gate layer 2 on the transparent base substrate 1.

A gate insulating layer 3 including a first PDMS film or a first derivative of PDMS film 31 formed on the transparent gate layer 2, and a first SiO₂ film formed from one surface of the first initial PDMS film or the first derivative of PDMS film 31 that faces the gate layer 2.

A source electrode 4 and a drain electrode 5 formed on the gate insulating layer 3.

An active layer 4 that is an organic semiconductor layer formed on and in directly contact with the source electrode 4 and the drain electrode 5.

In some embodiments, the organic thin film transistor further comprises a protecting layer 7 including a second PDMS film or a second derivative of PDMS (such as hydroxylated PDMS) film and a second SiO₂ film on one surface of the second PDMS film or the second derivative of PDMS film that faces away from the gate layer 2.

The disclosed organic thin film transistor includes first SiO₂ film formed by performing a UV treatment on one surface of a first initial PDMS layer or a first initial derivative of PDMS layer facing the gate layer. Thus a gate insulating layer of the disclosed organic thin film transistor can include the first SiO₂ film and the first PDMS film or the first derivative of PDMS film. Therefore, the problems of high threshold voltage and large leakage current caused by using a single PDMS film or a single derivative of PDMS film as the gate insulating layer can be solved.

The provision of the examples described herein (as well as clauses phrased as "such as," "e.g.," "including," and the like) should not be interpreted as limiting the claimed subject matter to the specific examples; rather, the examples are intended to illustrate only some of many possible aspects.

Accordingly, an organic thin film transistor, and a fabricating method thereof are provided. The disclosed method can includes: forming a transparent gate layer on a transparent base substrate; forming a first initial silicone polymer layer on the transparent gate layer; and performing an oxidization process to partially oxidize the first initial silicone polymer layer to form a gate insulating layer, including an oxidized inorganic sub-layer that contacts the transparent gate layer, and a non-oxidized organic sub-layer.

In some embodiments, forming a first initial silicone polymer layer on the transparent gate comprises: forming a polydimethylsiloxane film, or a derivative of polydimethylsiloxane film on the transparent gate.

In some embodiments, the derivative of polydimethylsiloxane film is a hydroxylated polydimethylsiloxane film.

In some embodiments, performing an oxidization process to partially oxidize the first initial silicone polymer layer comprises: performing an ultraviolet radiation treatment to partially oxidize the first initial silicone polymer layer to form the gate insulating layer, wherein the oxidized inorganic sub-layer is a $SiO_2$ sub-layer, and the non-oxidized organic sub-layer is an initial silicone polymer sub-layer; and performing a low-temperature solidifying process to cure the gate insulating layer after performing the ultraviolet radiation treatment.

In some embodiments, the method further comprises: forming a recessed part or the gate insulating layer; and using a solution process to form a source electrode and a drain electrode in the recessed part.

In some embodiments, the method further comprises: before using a solution process forming the source electrode and the drain electrode in the recessed part, coating a surface energy reducing solution on the gate insulating layer other than the recessed part.

In some embodiments, coating a surface energy reducing solution on the gate insulating layer other than the recessed part comprises: overlying the transparent base substrate on a carrying substrate that is coated with a surface energy reducing solution, such that a portion of the gate insulating layer other than the recessed part contacts with the surface energy reducing solution coated on the carrying substrate; and removing the carrying substrate.

In some embodiments, the method further comprises: forming an organic semiconductor layer that contacts with both the source electrode and the drain electrode as an active layer.

In some embodiments, forming the source electrode and the drain electrode comprises: dispersing a metal material in a hydrophilic solvent to form a solution; and applying the solution into the recessed part; and evaporating the hydrophilic solvent of the solution to firm the source electrode and the drain electrode by using a low-temperature solidifying process.

In some embodiments, the metal material is one of gold, aluminum, chromium, titanium, nickel, molybdenum, and an alloy thereof.

In some embodiments, wherein the hydrophilic solvent is an ethanol solvent.

In some embodiments, the recessed part is formed by using an imprinting lithography process.

In some embodiments, the surface energy reducing solution is a hexamethyldisilazane solution, or an octadecyltrichlorosilane solution.

In some embodiments, the method further comprises: a material of the active layer is one of polythiophene, polyaniline, polypyrrole, polyfluorene, pentacene, and titanyl phthalocyanine.

In some embodiments, a material of the transparent gate layer is one of indium tin oxide, indium zinc oxide, and graphene.

In some embodiments, the organic semiconductor layer is formed by using an ink-jet printing method.

In some embodiments, the method further comprises: forming a protecting layer on the active layer, including: forming a second initial silicone polymer layer on the active layer; performing an oxidization process to partially oxidize the second initial silicone polymer layer to form an oxidized inorganic protecting sub-layer and a non-oxidized organic protecting sub-layer.

In some embodiments, forming a protecting layer on the active layer further including: performing an ultraviolet radiation treatment to partially oxidize the second initial silicone polymer layer to form the protecting layer, wherein the oxidized inorganic protecting sub-layer is a $SiO_2$ sub-layer, and the non-oxidized organic protecting sub-layer contacts the active layer; and performing a low-temperature solidifying process to cure the protecting layer after performing the ultraviolet radiation treatment.

In some embodiments, the second initial silicone polymer layer is a polydimethylsiloxane film, or a derivative of polydimethylsiloxane film.

In some embodiments, the first initial silicone polymer layer and the second initial silicone polymer layer are formed by using a coating process, or a spin coating process.

In some embodiments, the low-temperature solidifying process to the gate insulating layer is performed in a temperature range between 20° C. to 60° C.; and the low-temperature solidifying process to the protecting layer is performed in a temperature range between 20° C. to 60° C.

In some embodiments, the low-temperature solidifying process to the gate insulating layer has a duration between 4 hours to 8 hours; and the low-temperature solidifying process to the protecting layer has a duration between 4 hours to 8 hours.

Another aspect of the disclosed provided an organic thin film transistor, comprising: a transparent base substrate; a transparent gate layer on the base substrate; and a gate insulating layer formed by partially oxidizing a first initial silicone polymer layer on the transparent gate layer, wherein the gate insulating layer includes an oxidized inorganic sub-layer that contact the transparent gate layer, and a non-oxidized organic sub-layer on the oxidized organic sub-layer.

In some embodiments, the silicone polymer layer is a polydimethylsiloxane film or a derivative of polydimethylsiloxane layer; the oxidized inorganic sub-layer is a $SiO_2$ film and the non-oxidized organic sub-layer is a polydimethylsiloxane film or a derivative of polydimethylsiloxane film.

In some embodiments, the organic thin film transistor further comprises: a protecting layer formed by partially oxidizing a second initial silicone polymer layer.

In some embodiments, the protecting layer include a $SiO_2$ film and a polydimethylsiloxane film, or the protecting layer include a $SiO_2$ film and a derivative of polydimethylsiloxane film.

Although the disclosed subject matter has been described and illustrated in the foregoing illustrative embodiments, it is understood that the present disclosure has been made only by way of example, and that numerous changes in the details of embodiment of the disclosed subject matter can be made without departing from the spirit and scope of the disclosed subject matter, which is only limited by the claims which follow. Features of the disclosed embodiments can be combined and rearranged in various ways. Without departing from the spirit and scope of the disclosed subject matter, modifications, equivalents, or improvements to the disclosed subject matter are understandable to those skilled in the art and are intended to be encompassed within the scope of the present disclosure.

What is claimed is:

1. A method for forming an organic thin film transistor (OTFT), comprising:
   forming a transparent gate layer on a transparent base substrate, the transparent gate layer and the transparent base substrate being transparent to ultraviolet light;
   forming a first initial silicone polymer layer on the transparent gate layer;
   performing a first oxidization process to partially oxidize the first initial silicone polymer layer to form a gate insulating layer, including an oxidized inorganic sub-layer and a non-oxidized organic sub-layer; and
   forming a source electrode and a drain electrode that are buried within the non-oxidized organic sub-layer, each of the source electrode and the drain electrode having a bottom side, and the bottom side surface of each of the source electrode and the drain electrode facing the transparent gate layer and contacting the non-oxidized organic sub-layer,
   wherein:
   the transparent gate layer is buried within the oxidized inorganic sub-layer, and the oxidized inorganic sub-layer covers a top surface and side surfaces of the transparent gate layer, and
   the first oxidization process includes a first ultraviolet radiation treatment that emits ultraviolet light passing through the transparent base substrate and the transparent gate layer.

2. The method of claim 1, wherein the forming the first initial silicone polymer layer on the transparent gate layer comprises:
   forming a polydimethylsiloxane film or a derivative of polydimethylsiloxane film on the transparent gate layer.

3. The method of claim 1, wherein the forming the first initial silicone polymer layer on the transparent gate layer comprises:
   forming a polydimethylsiloxane film or a hydroxylated polydimethylsiloxane film on the transparent gate layer.

4. The method of claim 1, wherein the performing the first oxidization process to partially oxidize the first initial silicone polymer layer comprises:
   performing the first ultraviolet radiation treatment to partially oxidize the first initial silicone polymer layer to form the gate insulating layer, wherein the oxidized inorganic sub-layer includes $SiO_2$, and the non-oxidized organic sub-layer includes the first initial silicone polymer; and
   performing a first low-temperature solidifying process to cure the gate insulating layer after performing the first ultraviolet radiation treatment.

5. The method of claim 4, wherein:
   the first low-temperature solidifying process to the gate insulating layer is performed in a temperature range between 20° C. to 60° C., and over a duration between 4 hours to 8 hours.

6. The method of claim 1, further comprising:
   forming a recessed part on the gate insulating layer by using an imprinting lithography process; and
   using a solution process to form the source electrode and the drain electrode that are buried within the non-oxidized organic sub-layer in the recessed part.

7. The method of claim 6, further comprising:
   before using the solution process to form the source electrode and the drain electrode in the recessed part, coating a surface energy reducing solution on the gate insulating layer other than the recessed part.

8. The method of claim 7, wherein the coating the surface energy reducing solution on the gate insulating layer other than the recessed part comprises:
   overlying the transparent base substrate on a carrying substrate that is coated with a surface energy reducing solution, wherein a portion of the gate insulating layer other than the recessed part contacts with the surface energy reducing solution coated on the carrying substrate; and
   removing the carrying substrate.

9. The method of claim 7, wherein:
   a material of the transparent gate layer includes one of indium tin oxide, indium zinc oxide, and graphene; and
   the surface energy reducing solution includes a hexamethyldisilazane solution, or an octadecyltrichlorosilane solution.

10. The method of claim 6, further comprising:
    forming an organic semiconductor layer that contacts with both the source electrode and the drain electrode as an active layer;
    wherein a material of the active layer includes one of polythiophene, polyaniline, polypyrrole, polyfluorene, pentacene, and titanyl phthalocyanine.

11. The method of claim 10, further comprising:
    forming a protecting layer on the active layer, including:
       forming a second initial silicone polymer layer on the active layer; and
       performing a second oxidization process to partially oxidize the second initial silicone polymer layer to form an oxidized inorganic protecting sub-layer and a non-oxidized organic protecting sub-layer.

12. The method of claim 11, wherein:
    the organic semiconductor layer is formed by using an ink-jet printing method; and
    the first initial silicone polymer layer and the second initial silicone polymer layer are formed by using a coating process or a spin coating process.

13. The method of claim 11, wherein the performing the second oxidation process comprises:
    performing a second ultraviolet radiation treatment to partially oxidize the second initial silicone polymer layer to form the protecting layer, wherein the oxidized inorganic protecting sub-layer includes $SiO_2$, and the non-oxidized organic protecting sub-layer contacts the active layer; and
    performing a third low-temperature solidifying process to cure the protecting layer after performing the second ultraviolet radiation treatment.

14. The method of claim 11, wherein the second initial silicone polymer layer includes a polydimethylsiloxane film or a derivative of polydimethylsiloxane film.

15. The method of claim 6, wherein the using the solution process to form the source electrode and the drain electrode comprises:
    dispersing a metal material in a hydrophilic solvent to form a solution;
    applying the solution into the recessed part; and
    evaporating the hydrophilic solvent of the solution to form the source electrode and the drain electrode by using a second low-temperature solidifying process.

16. The method of claim 15, wherein:
    the metal material includes one of gold, aluminum, chromium, titanium, nickel, molybdenum, and an alloy thereof; and
    the hydrophilic solvent includes an ethanol solvent.

* * * * *